United States Patent [19]

Bradley

[11] 4,103,182

[45] Jul. 25, 1978

[54] PROGRAMMABLE TRANSFER GATE ARRAY

[75] Inventor: Havyn E. Bradley, Fort Collins, Colo.

[73] Assignee: Hewlett-Packard Company, Palo Alto, Calif.

[21] Appl. No.: 719,541

[22] Filed: Sep. 1, 1976

[51] Int. Cl.² .................... H03K 19/20; H03K 19/08; G06F 7/38
[52] U.S. Cl. .................................. 307/203; 307/205; 307/215; 307/218; 307/270; 364/716
[58] Field of Search ............... 307/205, 203, 207, 215, 307/218, 270, 241–243; 340/716

[56] References Cited

U.S. PATENT DOCUMENTS

| 3,829,710 | 8/1974 | Hirasawa et al. | 307/215 X |
| 3,982,138 | 9/1976 | Luisi et al. | 307/205 |
| 3,989,955 | 11/1976 | Suzuki | 307/205 |
| 3,999,081 | 12/1976 | Nakajima | 307/205 |
| 4,021,656 | 5/1977 | Caudel et al. | 235/156 |

Primary Examiner—Larry N. Anagnos
Attorney, Agent, or Firm—Michael L. Sherrard

[57] ABSTRACT

A programmable transfer gate array generates control signals as functions of input variables in a digital logic circuit by using two-phase logic requiring no quiescent D.C. power consumption.

1 Claim, 7 Drawing Figures

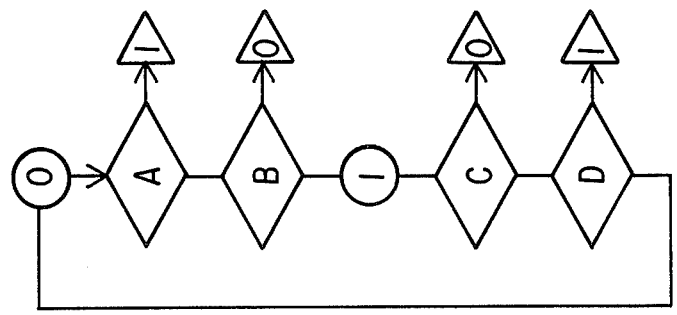
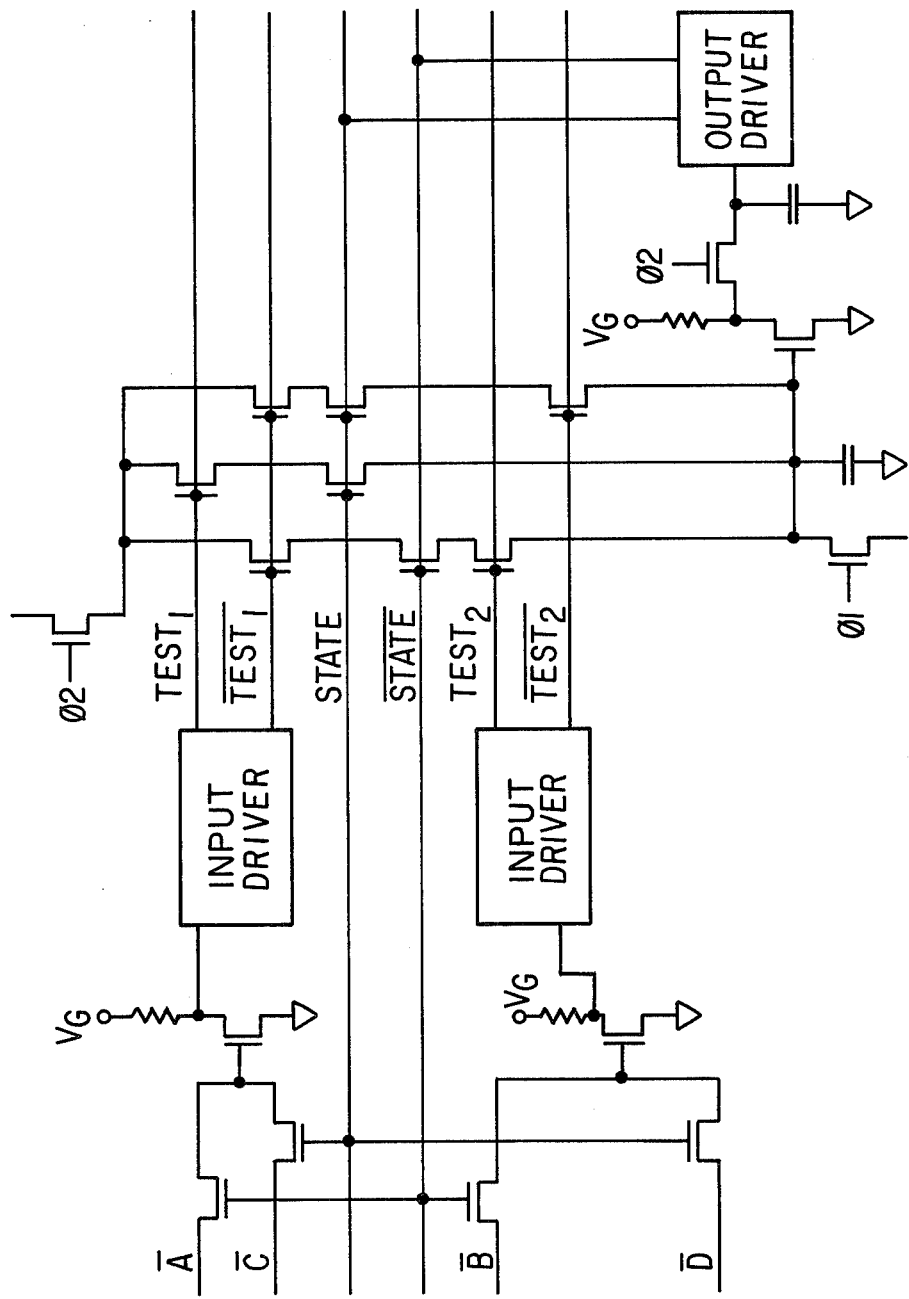
FIG 4
FIG 5

PROGRAMMABLE TRANSFER GATE ARRAY

BACKGROUND AND SUMMARY OF THE INVENTION

In many digital designs there arises a need to generate many control signals as functions of a number of input variables. Typically the input variables are a combination of state bits (a logical address) and status bits (of hardware elements). The output control signals are typically a new combination of state bits and status bits, the signal generation being analogous to a logical decision with alternative branches. Prior art circuits adapted to perform this function are known as Programmed Logic Arrays (PLAs). A PLA allows an output generating line to pull to a supply voltage provided that all of the selected input variables are false. A PLA constructed in accordance with the prior art is illustrated in FIG. 1. Analysis of the PLA reveals numerous disadvantages. First, since most of the Output Generating Lines 10 are false (low voltage), power is needlessly dissipated through Resistors 20. Second, the PLA requires ground lines (not illustrated) to be interspersed between the Output Generating Lines 10 for connection with transfer FETs 30 to provide grounds for the Output Generating Lines 10. Third, the Output Generating Lines 10 cannot be directly interconnected ("wire-or'ed") since they would interfere with each other (the grounded lines would pull down otherwise true lines). This requires additional circuitry such as the OR-ing Inverter 40 to logically combine the Output Generating Lines 10. Finally, as the PLA gets large the capacitance of the Output Generating Lines 10 increase requiring larger pull-up loads (Resistors 20). This rapidly increases the power consumption of the PLA.

It is therefore an object of the present invention to generate control signals as functions of input variables.

It is a further object of the present invention to minimize the power consumption of a programmable transfer gate array.

It is a further object of the present invention to reduce the array size by eliminating the interspersed ground lines.

These objects are accomplished in the preferred embodiment of the present invention by precharging a capacitance and detecting certain inputs during a first phase and subsequently altering the logical charge on the capacitance during a second phase upon detection of a given combination of logic states upon the inputs. The charge upon the capacitance is detected during the second phase and a control signal is generated in response thereto.

DESCRIPTION OF THE DRAWINGS

FIG. 4 is a detailed schematic diagram of a PTGA with a multiplied input built in accordance with the present invention.

FIG. 5 is a logic flow block diagram implemented by the circuits illustrated in FIGS. 1, 3 and 4.

DESCRIPTION OF THE PREFERRED EMBODIMENT

Figure 1:
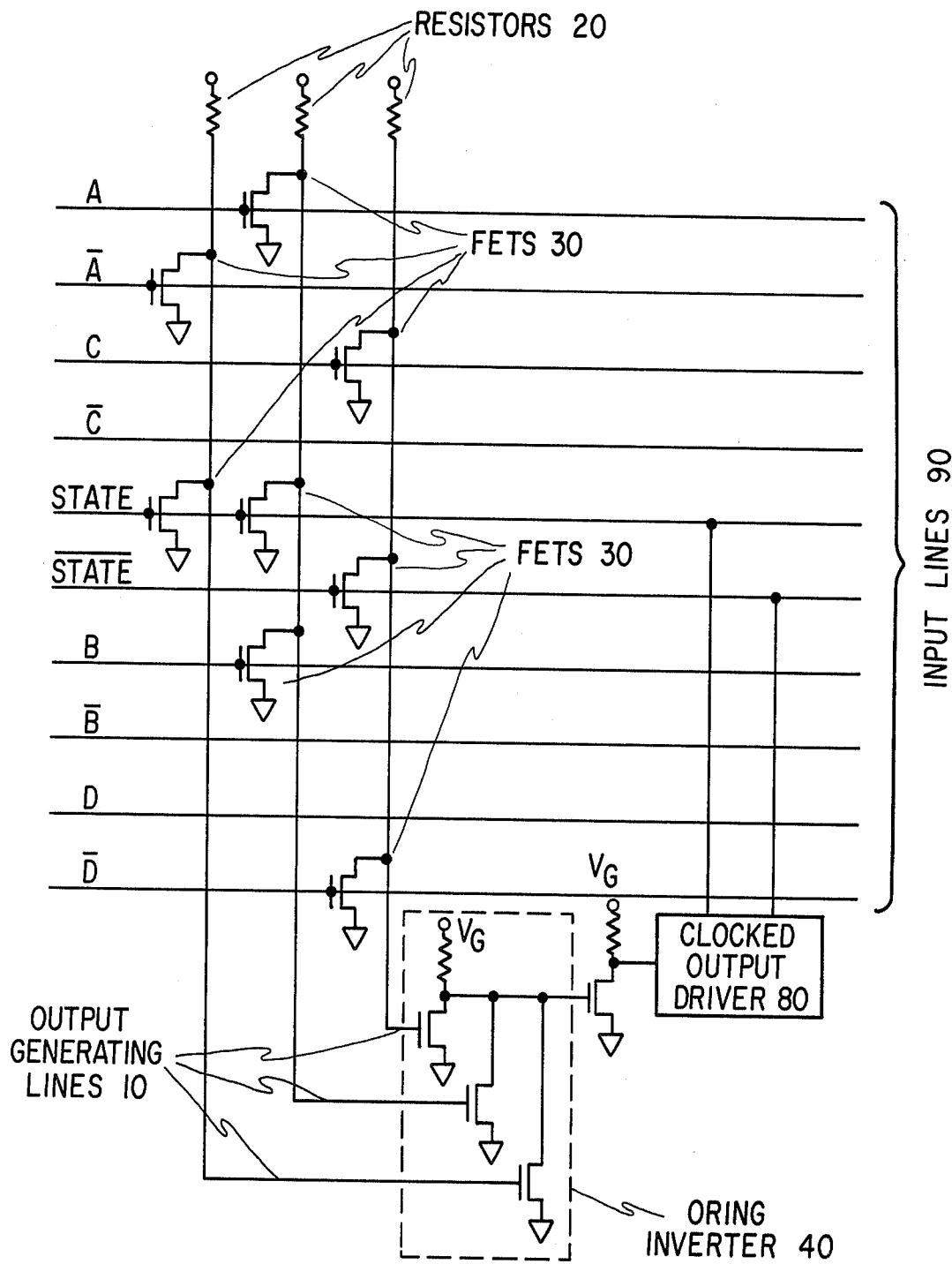
FIG. 1 is a detailed schematic diagram of a PLA built in accordance with the prior art.
Figure 2:
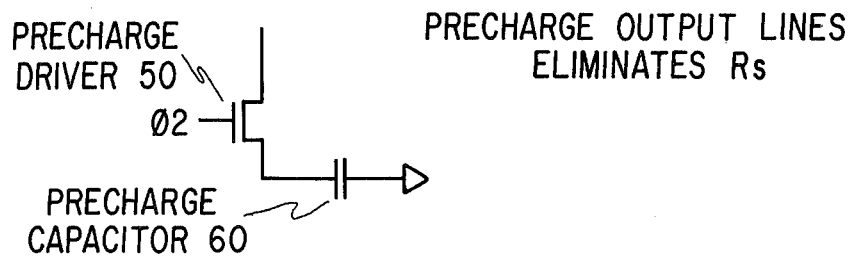
FIG. 2 is a detailed schematic diagram of a precharge driver circuit.

A Precharge Driver is illustrated in FIG. 2. By replacing each resistor 20 in FIG. 1 with a Precharge Driver 50 and a Precharge Capacitance 60 and by using the time relations described below, the resistors 20 and the D.C. power which flows through resistors 20 can be eliminated. Note that Precharge Capacitance 60 may be a capacitance inherent upon the line and need not be a separate component. Precharge Capacitance 60 is charged during a first phase. During a subsequent second phase the input lines 90 are enabled which discharges logically selected Output Generating Lines 10 through the FETs 30. Any Output Generating Line which remains charged will result in a high voltage level (logically true) being applied to the clocked output driver 80 during the sequent first phase. The output driver 80 then generates the responsive control signal. This improvement greatly reduces the power consumption of a PLA by eliminating a D.C. power flow through Resistors 20.

Figure 3:
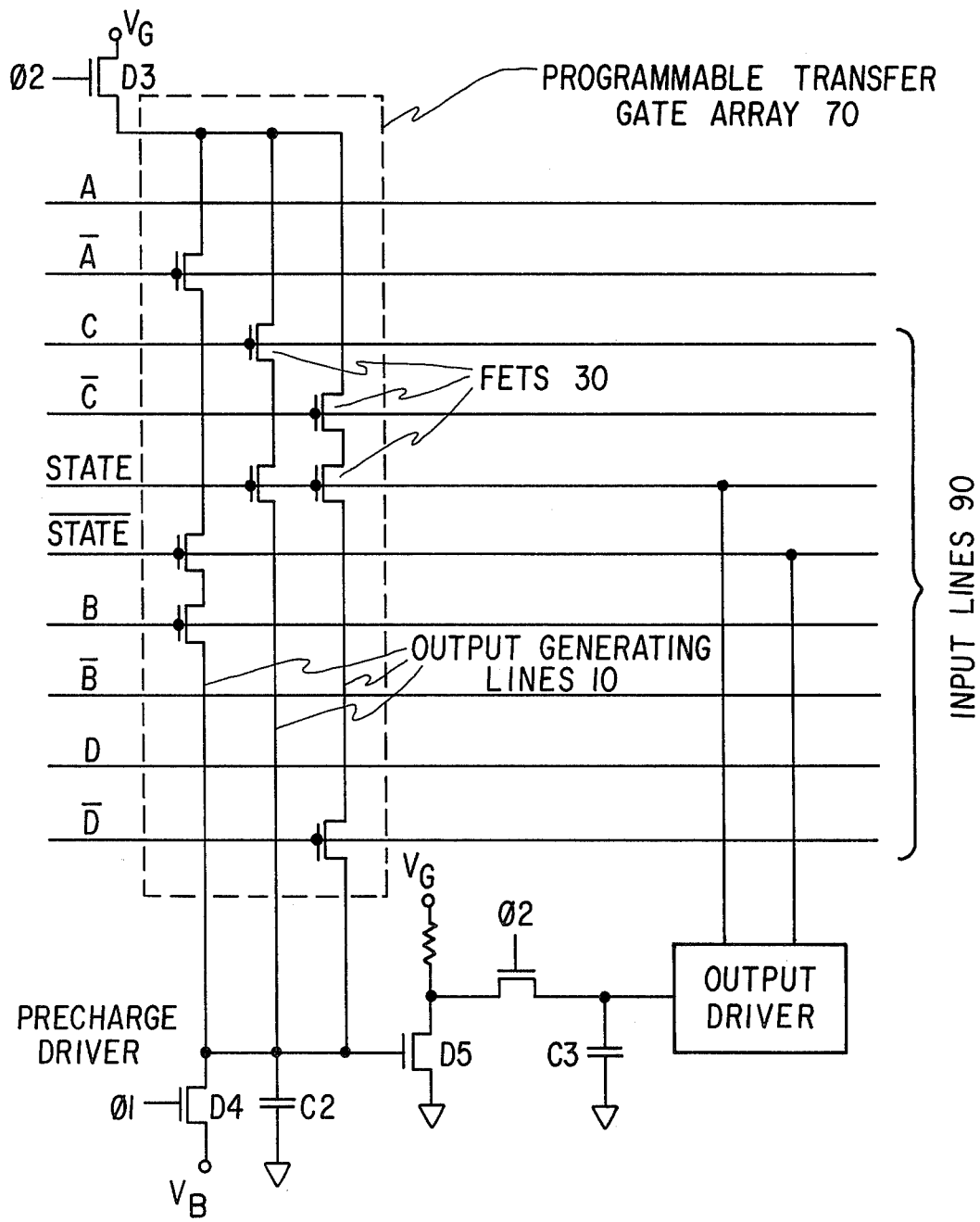
FIG. 3 is a detailed schematic diagram of a PTGA built in accordance with the present invention.
Figure 6:
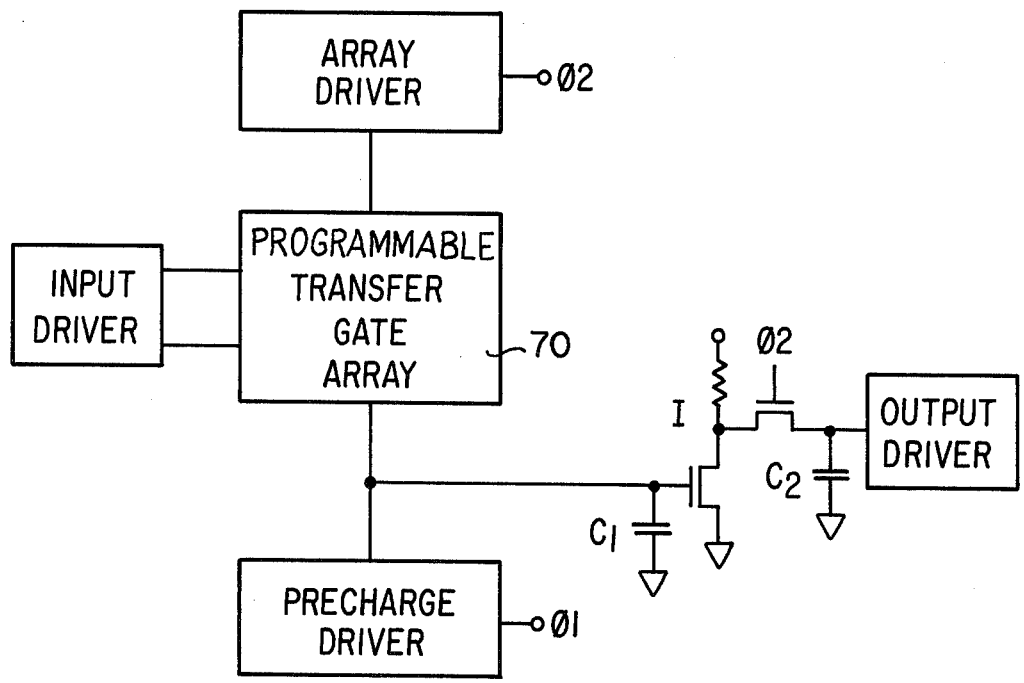
FIG. 6 is a block diagram of the circuit of FIG. 3.
Figure 7:
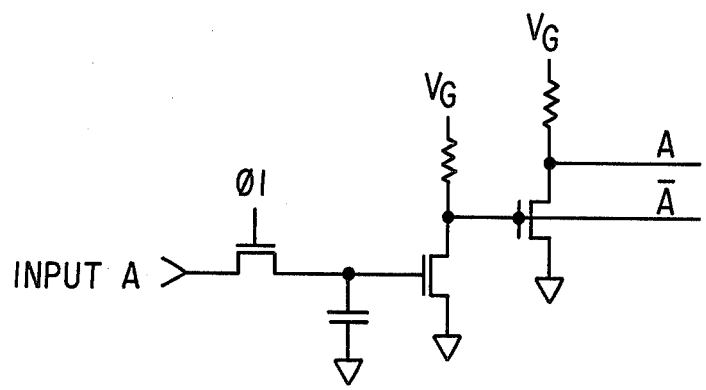
FIG. 7 is a detailed schematic diagram of an input driver.

FIG. 3 is a detailed schematic drawing of a Programmable Transfer Gate Array (PTGA), a further improvement over the circuit described above. A block diagram of the PTGA is given in FIG. 6. During a first clock phase the pre-input information is sampled by an input driver such as the one illustrated in FIG. 7 and applied to inputs such as A and its complement $\overline{A}$. Simultaneously a precharge driver, D4, precharges capacitor $C_2$ to a voltage $V_B$.

Clock pulse 2 turns on array driver D3 which attempts to charge capacitance $C_2$ to a voltage $V_G$ through the Programmable Transfer Gate Array 70. Capacitance $C_2$ will be charged to a voltage $V_G$ only if at least one of the Output Generating Lines 10 has all of the FETs 30 in it, which act as transfer gates, enabled by the corresponding inputs. If an Output Generating Line 10 is "on", Capacitance $C_2$ will charge to $V_G$ and output driver D5 will discharge output capacitor $C_3$. Alternatively, if no Output Generating Lines 10 are "on", output driver D5 will be "off" and output capacitor $C_3$ will charge to a voltage $V_G$. When clock pulse two turns off, output capacitor $C_3$ retains its value during the sequent phase 1 in which the input variables are again allowed to change states by the input drivers. Capacitance $C_2$ is again precharged and the PTGA is ready for another cycle. It can now be appreciated that the present invention overcomes all of the disadvantages enumerated above, found in the prior art. First, no D.C. power is required. Second, no ground lines interspersed amongst the output generating lines are required which results in a significant savings in array size. Third, the Output Generating Lines 10 can be directly "wire-or'ed" which results in a savings in circuitry. Finally, the circuit is relatively insensitive to increased size (and therefore capacitance) due to the active and switched drivers for capacitance charging.

A further improvement upon the present invention is illustrated in FIG. 4, a PTGA with multiplexed inputs. This is best explained by referring also to FIG. 5, a logic flow block diagram which has been implemented in FIGS. 1, 3 and 4 for comparison. By limiting the number of input variables (A, B, C and D) which can be tested during any states (0 or 1) the input lines can be multiplexed using a further application of the Programmable Transfer Gate Array. The input TEST, is selected from either the $\overline{A}$ or the $\overline{C}$ input as determined by the STATE bit. Of course more than one state bit can be easily implemented and any number of inputs can be utilized. The result of the multiplexers is a significant reduction in the size of the PTGA. Note that it is possible for an output generating line to not inquire the status of the TEST or $\overline{\text{TEST}}$ signal. In this case the input to output driver 50 and therefore the status of the TEST and $\overline{\text{TEST}}$ bits is indeterminate. However, the TEST and $\overline{\text{TEST}}$ bits are defined whenever an output generating line inquires their status. This is accomplished by having an input PTG for each outut generating line 10 which inquires TEST or $\overline{\text{TEST}}$. The input parameters for the PTG will be a subset of the input parameters of the associated output generating line 10.

I claim:

1. Apparatus for generating a digital control signal as a function of a plurality of digital input signals having first and second logic states, the apparatus comprising:

storage means for storing a signal applied thereto;

a pre-driver connected to said storage means for selectively applying a first signal thereto;

a line driver for selectively generating a second signal;

first and second transfer lines each connected between said line driver and said storage means and responsive to a selected first and second set of digital input signals respectively, each for transferring the second signal to said storage means in response to all of the selected digital input signals having the first value and said line driver generating the second signal;

input means having a first output coupled to said first transfer line for generating a digital input signal of the first set having a logic state representative of a signal applied thereto and having a second output coupled to said second transfer line for generating a digital input signal of the second set having a logic state representative of the complement of the signal applied thereto;

means for generating third and fourth signals;

a third transfer line connected for selectively applying the third signal to said input means in response to a selected subset of the first set of digital input signals attaining the first logic state;

a fourth transfer line connected for selectively applying the fourth signal to said input means in response to a selected subset of the second set of digital input signals attaining the first logic state; and output means connected to said storage means for selectively detecting the value stored by said storage means and for generating a digital control signal in response thereto.

* * * * *